United States Patent
Ko et al.

(10) Patent No.: US 7,526,712 B2
(45) Date of Patent: Apr. 28, 2009

(54) DEINTERLEAVING APPARATUS AND METHOD USING INNER MEMORY AND OUTER MEMORY

(75) Inventors: Jun-Won Ko, Seoul (KR); Suk-Jin Jung, Yongin-si (KR)

(73) Assignee: Samsung Electronics Co., Ltd (KR)

( * ) Notice: Subject to any disclaimer, the term of this patent is extended or adjusted under 35 U.S.C. 154(b) by 451 days.

(21) Appl. No.: 11/083,529

(22) Filed: Mar. 18, 2005

(65) Prior Publication Data
US 2005/0210359 A1   Sep. 22, 2005

(30) Foreign Application Priority Data
Mar. 18, 2004   (KR)   ...................... 10-2004-0018420

(51) Int. Cl.
*H03M 13/00* (2006.01)
(52) U.S. Cl. .................. 714/762; 714/702; 714/784; 714/795; 375/262; 375/341
(58) Field of Classification Search ................ 714/702, 714/752, 786, 762, 784, 795; 375/262, 341
See application file for complete search history.

(56) References Cited

U.S. PATENT DOCUMENTS

| | | | |
|---|---|---|---|
| 5,940,863 A | 8/1999 | Fimoff et al. | |
| 6,233,662 B1 | 5/2001 | Prince, Jr. | |
| 6,625,763 B1 | 9/2003 | Boner | |
| 7,024,596 B2 * | 4/2006 | Xin | 714/702 |
| 7,146,545 B2 * | 12/2006 | Ohbuchi et al. | 714/701 |
| 2001/0021169 A1 | 9/2001 | Kim | |
| 2003/0097621 A1 | 5/2003 | Xin | |

* cited by examiner

*Primary Examiner*—Esaw T Abraham
(74) *Attorney, Agent, or Firm*—The Farrell Law Firm, PC

(57) ABSTRACT

An apparatus and a method for deinterleaving using an inner memory and an outer memory. The apparatus includes data receiving apparatus of a mobile equipment in a mobile communication system including the mobile equipment and a base station for transmitting data to the mobile equipment through a radio channel. The apparatus includes a deinterleaving unit having a deinterleaver and an outer memory separately located with the deinterleaver. The deinterleaver stores address information including an address of the outer memory and values corresponding to the address of the outer memory in an inner memory. The outer memory stores the data to be deinterleaved, and a decoder for decoding the deinterleaved data.

5 Claims, 7 Drawing Sheets

105 — A0,A1,A2,A3,A4,A6,A7,A8,A9,A10,A11,A12,A13,A14,A15 ....

106 — A0,A13,A10,A7,A4,A1,A14,A11,A8,A5,A2,A15,A12,A9,A6,A3 ....

107 — A0,A13,A10,A7,A4,Ae,Ae,Ae,A8,A5,A2,A15,A12,A9,A6,A3 ....

108 — A0,Ae,A2,A3,A4,A5,A6,A7,A8,A9,A10,Ae,A12,A13,Ae,A15 ....

DEINTERLEAVING APPARATUS AND METHOD USING INNER MEMORY AND OUTER MEMORY

PRIORITY

This application claims priority to an application entitled "Deinterleaving Apparatus and Method using Inner Memory and Outer Memory" filed in the Korean Intellectual Property Office on Mar. 18, 2004 and assigned Ser. No. 2004-18420, the contents of which are incorporated herein by reference.

BACKGROUND OF THE INVENTION

1. Field of the Invention

The present invention relates generally to an apparatus and a method for satellite Digital Multimedia Broadcast (DMB), and more particularly to an apparatus and a method for convolutional interleaving and deinterleaving in a satellite DMB system.

2. Description of the Related Art

Generally, viterbi decoders or Reed-Solomon (RS) decoders, which are used for a digital signal transmission, have superior error correction abilities. However, it is difficult for the decoders to correct continuously occurring burst errors that are larger than a predetermined size. In order to complement the aforementioned disadvantage, a sequence of input signals is changed by an interleaver/deinterleaver, such that the burst errors are dispersed. Therefore, the decoders may efficiently perform error correction.

FIG. 1A is a block diagram illustrating a conventional digital transmitter and receiver using an interleaver and a deinterleaver, and FIG. 1B is a diagram illustrating a change of signals interleaved by an interleaver.

Referring to FIG. 1A, an encoder 101 of the transmitter adds supplementary information to a signal or changes types of a signal for an error correction in the receiver. Reference number 105 of FIG. 1B represents a signal encoded by the encoder 101. The signal 105 will be changed by the interleaver 102. Reference number 106 of FIG. 1B represents the signal 105 having the sequence changed by the interleaver 102. The signal 106 having passed through the interleaver 102 includes three continuous errors occurring in portions A1, A14, and A11 due to exterior errors or noise, as shown in a reference number 107. If the number of burst errors capable of being corrected by an encoder 101 and a decoder 104 is two, it is impossible to properly correct the three continuous errors. However, an order of the signal 106 that is passed through the interleaver 102 reverts to an original order of the signal in a deinterleaver 103 in the receiver, such that the burst errors are dispersed. Accordingly the decoder 104 can properly correct the errors.

Additionally, the interleaver and deinterleaver described above may be generally classified into a block interleaver and a convolutional interleaver.

FIG. 2 illustrates a conventional convolutional interleaver and deinterleaver having superior characteristics in memory efficiency. Referring to FIG. 2, a first input signal is input to a $0^{th}$ row 201 of the interleaver and the next input signal is input to a $1^{th}$ row 202. Accordingly, after a signal is input to a final $(n-1)^{th}$ row 203, a signal is input to the $0^{th}$ row 201 again. Because each row has different buffer sizes, input signals are differently delayed. Therefore, an output sequence is different from the input sequence. That is, a buffer delay does not exist in the $0^{th}$ row 201 and a buffer delay of '1×m (m has a predetermined value)' exists in the $1^{st}$ row 202.

Accordingly, the deinterleaver is required in to enable the output sequence to coincide with the input sequence. In the deinterleaver, buffers are arranged along the rows in an order based on the buffer sizes, which is opposite to the order of the buffers arranged in the interleaver, so that the final output signal coincides with the input signal of the interleaver.

FIG. 3 is a block diagram illustrating the interleaver illustrated in FIG. 2. Referring to FIG. 3, a row counter 300, which represents a row location of the interleaver, counts an input signal each time the input signal exist and obtains row information corresponding to a current input value. A column counter 301 counts a value of the row counter 300, which corresponds to the column counter 301, each time the value of the row counter generates and indicates a buffer location of the interleaver.

An address generator 303 generates an address of an outer memory 305 corresponding to a current input signal using different counter information, that is, information from the row counter 300 and the column counter 301. If the address is generated, a control signal generator 304 generates a read command, reads a memory value written before the address from the outer memory 305, and outputs the read memory value. The control signal generator 304 generates a write command and writes a new input signal in a location of an address equal to the address so that an interleaving operation is ended.

However, it is possible to make a wider range of change in the sequence, only when the number of rows in the interleaver and deinterleaver, and a deviation between buffer sizes of the rows increase according to a burst error increase, thereby dispersing the continuous errors. In such a case, because the size of a memory used as a delay buffer increases, the outer memory illustrated in FIG. 3 is used. When there is no outer memory corresponding to magnitudes of signals input and output to and from the interleaver, an interface between the interleaver and the outer memory is complicated.

Further, when there is no memory corresponding to magnitudes of signals input and output to and from the interleaver, all input signals pass through an interleaving process. Accordingly, when the address generator generates an address corresponding to the input signal and performs a reading operation and a writing operation for the outer memory, an access frequency between the interleaver and the outer memory increases. Consequently, power consumption increases.

Further, as illustrated in FIG. 2, it is simple to construct the convolutional interleaver and deinterleaver using a First Input First Output (FIFO). However, the convolutional interleaver is actually constructed using the block-type memory as illustrated in FIG. 3. Accordingly, the convolutional interleaver and deinterleaver must generate an address value of the memory using row information, which is a row value of the interleaver and deinterleaver to be read and written for current information, and location information of a buffer of a corresponding row. Therefore, when the address value of the memory increases, the number and the magnitudes of the counters also increase. Consequently, the number of the gates increases.

The conventional interleaver and deinterleaver have a complex construction because they use complex equations to generate the address of the outer memory and include counters using many registers. Further, in interfacing with the outer memory, the interleaver and deinterleaver transfers simple input signals or sequentially bundled input signals, such that power consumption increases.

SUMMARY OF THE INVENTION

Accordingly, the present invention has been designed to solve the above and other problems occurring in the prior art. It is an object of the present invention is to provide an apparatus and a method providing an interface with an outer memory having a high capacity for generating an address of the outer memory in order to construct an interleaver and deinterleaver using the outer memory.

It is another object of the present invention is to provide an apparatus and a method capable of reducing power consumption by decreasing an access frequency between an interleaver, a deinterleaver, and an outer memory.

In accordance with one aspect of the present invention, there is provided a data receiving apparatus of a mobile equipment in a mobile communication system including the mobile equipment and a base station for transmitting data to the mobile equipment through a radio channel. The apparatus includes: a deinterleaving unit having a deinterleaver and an outer memory separately located with the deinterleaver. The deinterleaver stores address information including an address of the outer memory and values corresponding to the address of the outer memory in an inner memory. The outer memory stores the data to be deinterleaved.

In accordance with another aspect of the present invention, there is provided a deinterleaving apparatus for receiving interleaved and transmitted data and restoring the data in an original data order in order to prevent burst errors of the data. The apparatus includes: an outer memory for storing data to be deinterleaved; a base address memory for storing address information including start addresses of each rows in an outer memory; a row counter for indicating a row location corresponding to a current input signal when input signals exist; an inner memory for storing address information including an address of the outer memory and values corresponding to the address of the outer memory; a column counter for increasing address information of the inner memory.

In accordance with further another aspect of the present invention, there is provided a method for deinterleaving data by a mobile equipment in a mobile communication system including the mobile equipment and a base station for transmitting data to the mobile equipment through a radio channel. The method includes the steps of: determining if a buffer location is an initial location when an input signal exists, reading buffer values from an outer memory according to address information stored in the inner memory, outputting a buffer value of the initial location, and writing the input signal in the initial location; increasing a value of the address information using a column counter, and determining if a changed buffer location is the initial location according to the increased address information; and writing current buffer values of rows of the inner memory in the outer memory according to the address information when the changed buffer location is the initial location.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE PREFERRED EMBODIMENT

Figures 1A, 1B:
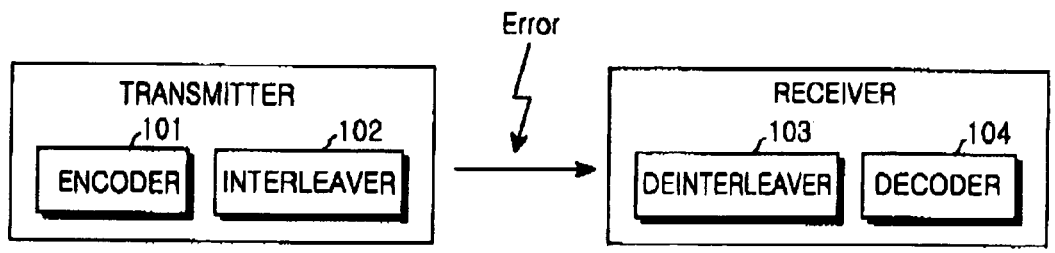
FIG. 1A is a block diagram illustrating a conventional digital transmitter and receiver using a general interleaver/deinterleaver.
FIG. 1B is a diagram illustrating a change of signals interleaved by an interleaver.

Preferred embodiments of the present invention will be described in detail herein below with reference to the accompanying drawings. It is noted that the same reference numerals are used to designate the same elements as those shown in other drawings. Additionally, in the following description of the present invention, a detailed description of known functions and configuration incorporated herein will be omitted when it may obscure the subject matter of the present invention.

As described above, the present invention proposes an apparatus and a method for efficiently generating and managing an address of an outer memory using an inner memory including relatively few logics. Further, the present invention proposes an apparatus and a method providing an interface with an outer memory using a scheme for temporarily storing input signals by using an inner memory, and reduce power consumption by decreasing an access frequency for the outer memory.

Figure 2:
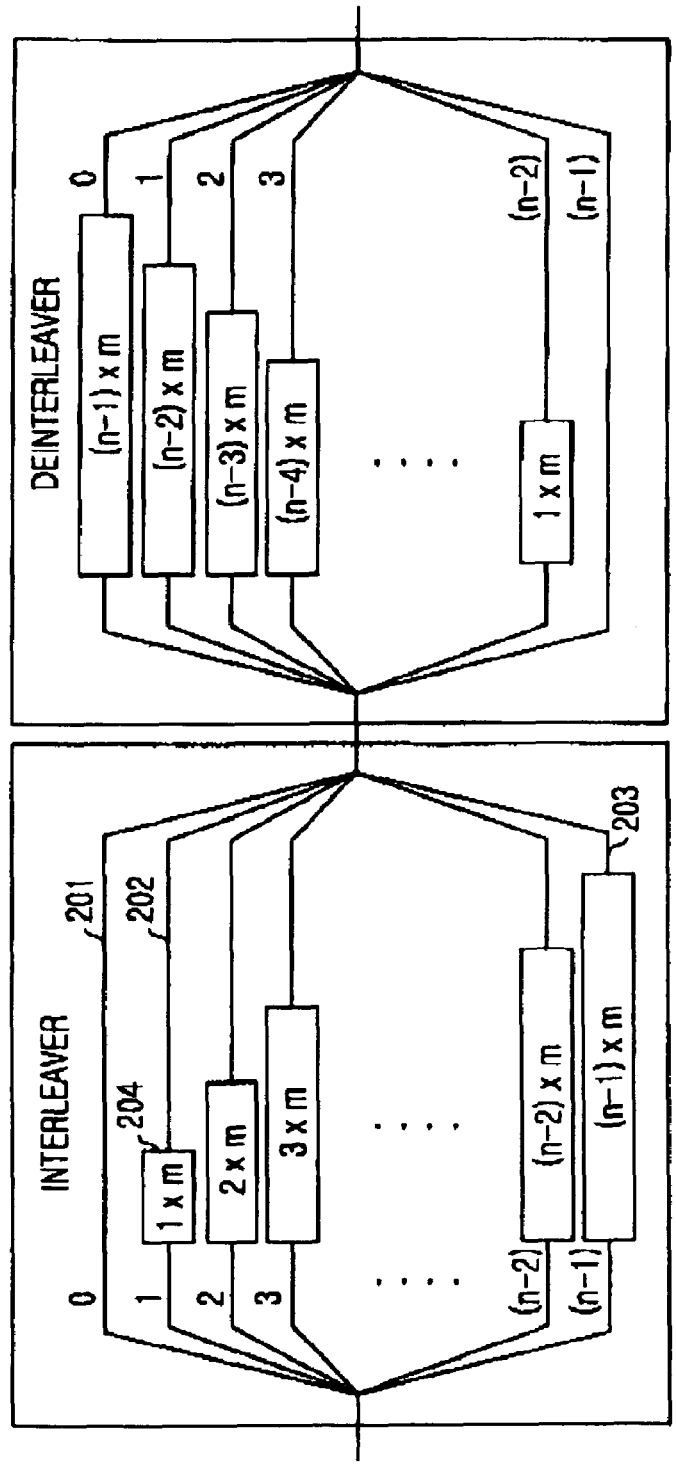
FIG. 2 is a diagram illustrating a conventional convolutional interleaver and deinterleaver.
Figure 3:
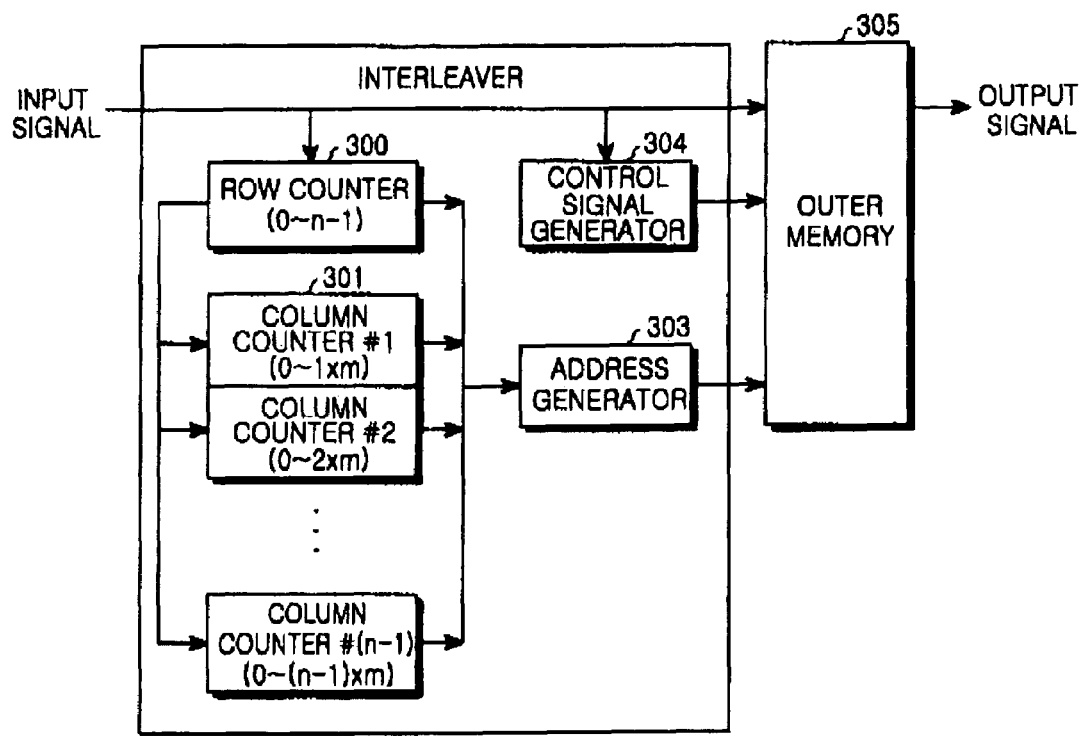
FIG. 3 is a block diagram illustrating the interleaver illustrated in FIG. 2.
Figure 4:
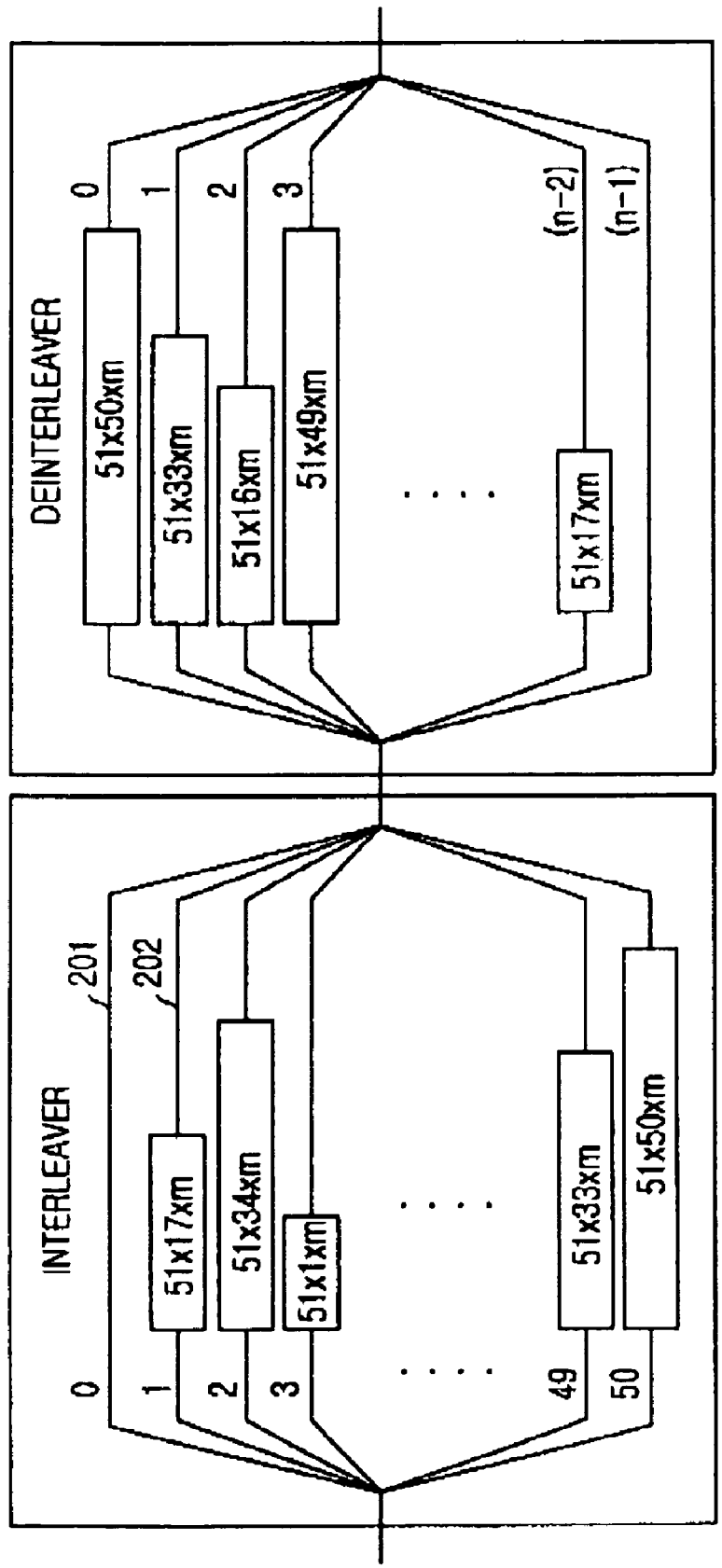
FIG. 4 is a diagram illustrating a buffer delay structure of a bit interleaver and deinterleaver proposed by a DMB specification according to a preferred embodiment of the present invention.

FIG. 4 is a diagram illustrating a buffer delay structure of a bit interleaver and deinterleaver proposed by a DMB specification according to a preferred embodiment of the present invention. In contrast with the prior art described in FIG. 2, FIG. 4 illustrates an interleaver and deinterleaver, in which a buffer delay corresponding to each row is not linearly increased according to an increase of row values from 0 to 49, but an order of the buffer delay corresponding to each row is changed by the interleaver and deinterleaver.

Because the interleaver and the deinterleaver have only different buffer delays and use identical operation methods, a description will be given based on the deinterleaver in the present invention.

Figure 5:
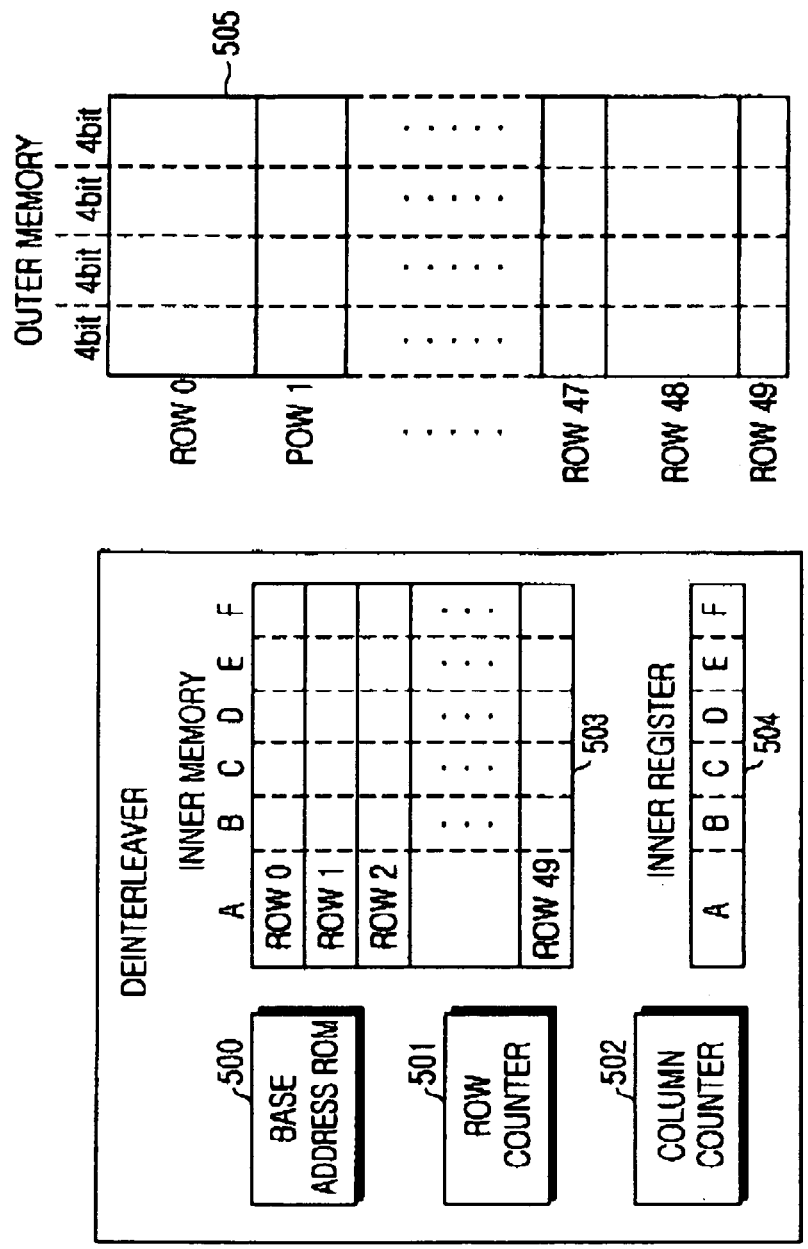
FIG. 5 is a diagram illustrating an inner memory in a satellite DMB deinterleaver according to a preferred embodiment of the present invention.

FIG. 5 is a diagram illustrating an inner memory in a satellite DMB deinterleaver according to a preferred embodiment of the present invention. Referring to FIG. 5, a base address Read Only Memory (ROM) 500 stores start location information of blocks corresponding to each row of an outer memory 505 and can be utilized as a ROM table. A row counter 501 is a counter indicating row locations, in which signals input to the deinterleaver must be stored, i.e., row values. Further, the row counter 501 increases by one according to input of a new value and has a period of 0 to 49. A column counter 502 indicates a delay buffer location for a row indicated by a corresponding row counter. In comparison with the conventional method, separate counters do not exist for each row value and only one counter exists, such that the number of registers and adder logics are reduced by about 80%. Therefore, it is possible to reduce the number of gates in the deinterleaver.

More specifically, the present invention proposes two schemes for a role of the inner memory 503.

In the prior art, a column counter for each row value continuously includes location information of a delay buffer for each row in addition to a simple function of the adder. However, in the present invention, because only one column counter exists, it is necessary to provide a separate space for storing the existing location information of the delay buffer. Accordingly, in the present invention, column counter information corresponding to each row value is stored using an inner memory including gates having the number of registers reduced by about 70% in comparison with the number of registers, when inner memories having the same storage capacity exist.

The other role of the inner memory 503 is a kind of cache role. That is, it is possible to reduce power consumption by decreasing an access frequency for the outer memory. Further, because the outer memory has a fixed size, the outer memory may have a bit size different from that of a signal actually input to the interleaver. Accordingly, it is efficient to use the inner memory in offsetting the difference between an input signals and a memory data bus.

Figure 6:
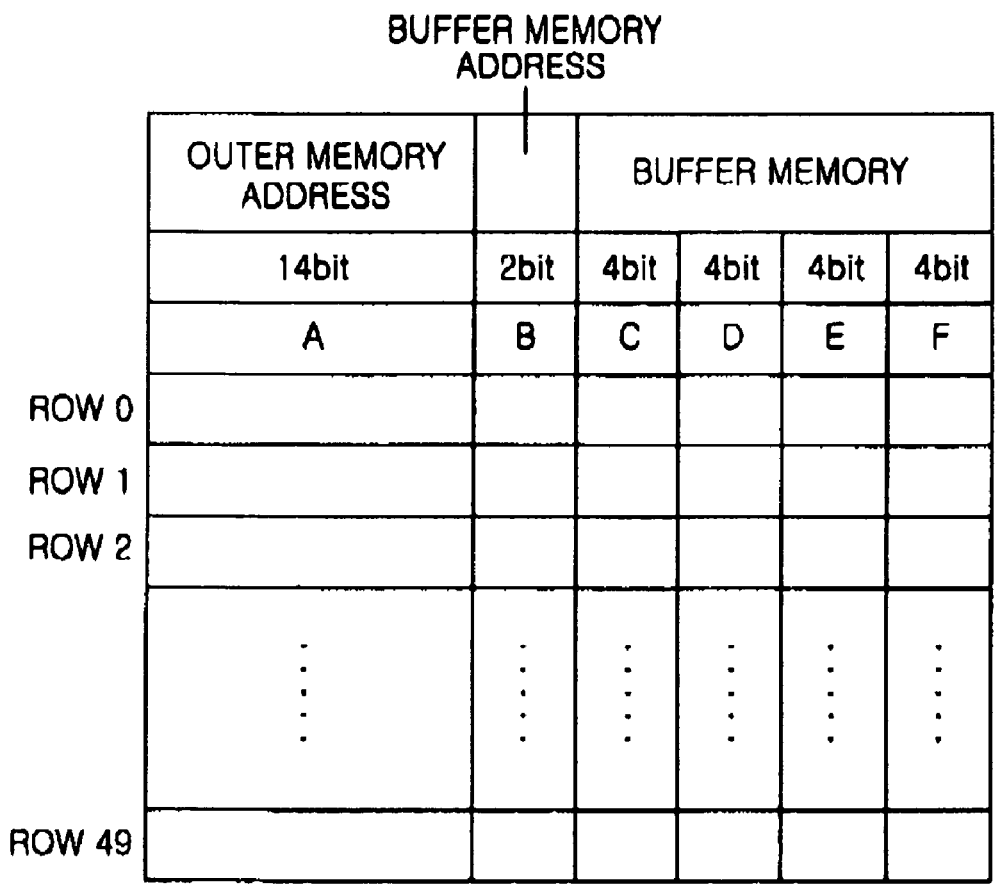
FIG. 6 is a diagram illustrating a detailed construction of an inner memory according to a preferred embodiment of the present invention.

FIG. 6 is a diagram illustrating a detailed construction of the inner memory. Referring to FIG. 6, the inner memory 503 includes 50 rows and stores information corresponding to the row 0 to the row 49. The first 14 bits A represent the address of the outer memory 505 for each row. For example, when an area A of the row 1 in the inner memory 503 represents '100', a $100^{th}$ location of the row 1 in the outer memory 505 is an area to which the deinterleaver currently accesses.

An area B in the inner memory 503 represents buffer areas C to F of the inner memory 503 to which the deinterleaver must access. For example, when the area B has a value of 1, a current row must output a value of the area D of the buffer areas C to F or write a new input value in the area D. Herein, the areas A and B in the outer memory 505 are determined by a column counter value for a current row value. That is, lower two bits of the column counter information represent the buffer area and upper 14 bits of the column counter information represent the area of the outer memory.

An inner register 504 reads a corresponding row value of the inner memory, outputs the buffer areas C to F, and newly stores a new input value, in order to process actual input and output values. The buffer areas of the inner memory and the inner register coincide with a data width of the outer memory. The outer memory 505 is a portion for actually performing a role of the delay buffer in the interleaver and deinterleaver, and includes sizes of the delay buffers corresponding to each row therein.

Figure 7:
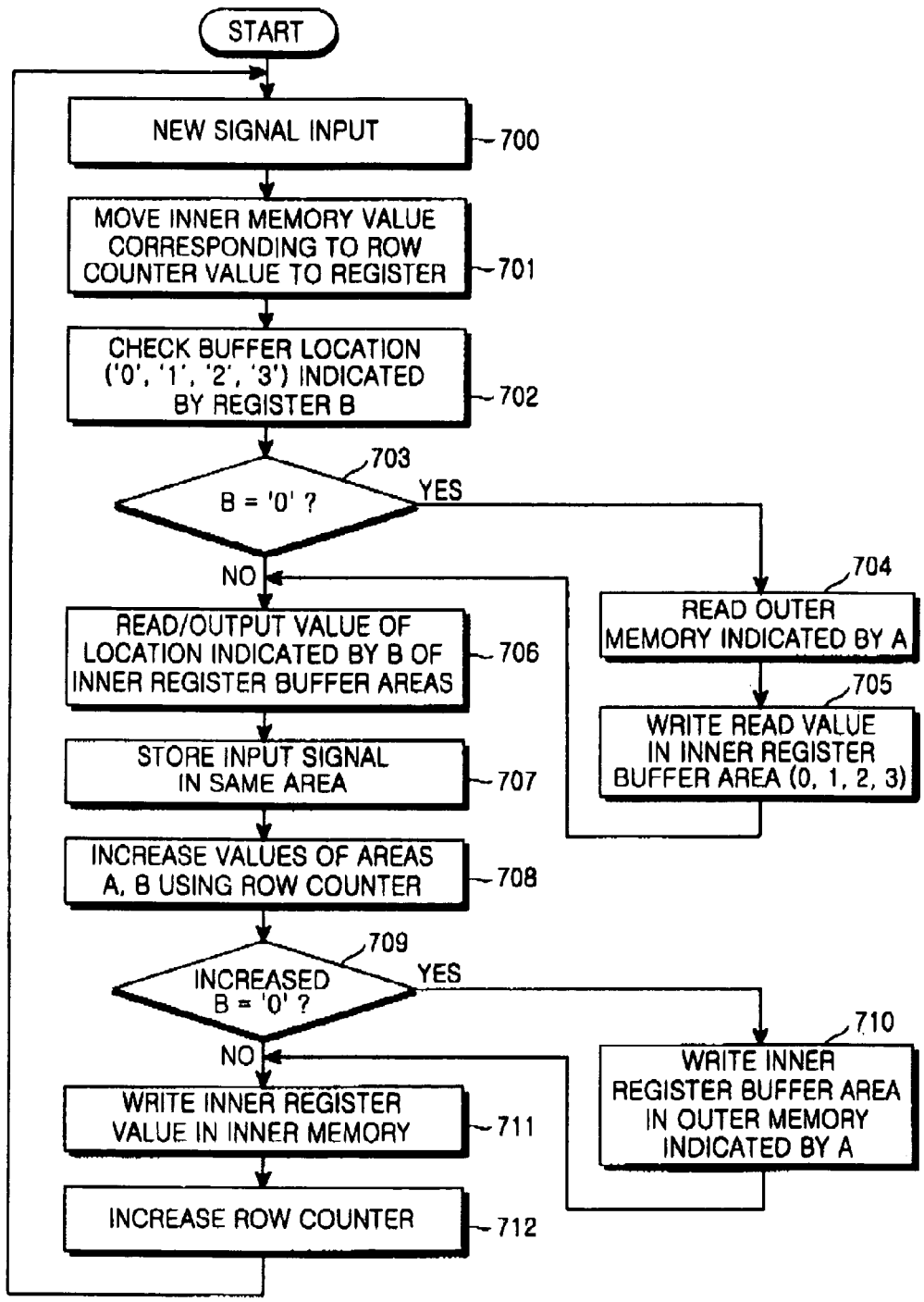
FIG. 7 is a flow diagram illustrating an operation method of a deinterleaver according to a preferred embodiment of the present invention.

Referring to FIG. 7, an operation method of the interleaver/deinterleaver as described above will be described. Referring to FIG. 7, a new signal is input to the interleaver in step 700. In step 701, the interleaver stores a value of the inner memory 503 corresponding to a row value, which must be currently accessed, in the inner register 504 with reference to a value of the row counter 501.

In step 702, the interleaver checks a value of the area B in the inner register. In step 703, the interleaver determines if the area B has a value of '0'. When the area B has the value of '0', a value of a buffer area in the inner register corresponding to a current row indicates that the value has been already written in a corresponding area of the outer memory in the previous state. Accordingly, the interleaver must read a new value of the outer memory. That is, the interleaver reads a value indicated by the area A in the inner register from the outer memory area indicated by a current value of the row counter 501, in step 704.

In step 705, the interleaver writes the value read from the outer memory in the buffer areas C to F of the inner register. That is, if the area B has the value of '0', it is a state in which the value of the outer memory is stored in the buffer area. However, if the area B does not have the value of '0', it is a state in which a value of the buffer area in the inner memory is stored.

When the buffer location does not represent the value of '0', the interleaver reads a value of the buffer area, which is indicated by the area B in the inner register, and outputs the read value to an exterior, in step 706. In step 707, the interleaver writes a new input signal in the buffer area indicated by the area B in the inner register. In step 708, the interleaver increases the column counter information of the areas A and B by one, using the column counter.

In step 709, the interleaver determines if the newly updated area B in the inner register has a value of '0'. If the area B in the inner register has the value of '0', this indicates that all values of the buffer areas in the inner memory and the inner register have been updated to new values. Accordingly, in order to write a value of the buffer area in the outer memory, the interleaver writes the value of the buffer area of the inner register in an area of the outer memory indicated by current column counter information in step 710.

If the area B in the inner register does not have the value of '0', the interleaver writes the value of the inner register in a corresponding row area of the inner memory in step 711. Then, in step 712, the interleaver increases the value of the row counter by one within a predetermined period 0 to 49. Thereafter, the interleaver waits for input of new signals.

As described above, the present invention provides an interleaver and deinterleaver including an inner memory corresponding to each row and a width of an outer memory proposed by the interleaver standard. Further, in the present invention, it is possible to use an address of an outer memory as one address using the address of the outer memory and a row counter for managing the address of an inner memory, instead of dividing the address of the outer memory into separate read address and write address.

Furthermore, the present invention gathers input values corresponding to the same row values at a time, transmits the input values to an outer memory, reads values of the outer memory at a time, and stores the read values in an inner memory for processing. Accordingly, the present invention can be simply realized. In addition, the present invention enables power loss to be reduced by decreasing an access frequency for an outer interface.

Although preferred embodiments of the present invention have been described for illustrative purposes, those skilled in the art will appreciate that various modifications, additions, and substitutions are possible, without departing from the scope and spirit of the invention as disclosed in the accompanying claims, including the full scope of equivalents thereof.

What is claimed is:

1. A method for deinterleaving data by a mobile equipment in a mobile communication system including the mobile equipment and a base station for transmitting data to the mobile equipment through a radio channel, the method comprising the steps of:

determining if a buffer location is an initial location when an input signal exists;

reading buffer values from an outer memory according to address information stored in the inner memory, outputting a buffer value of the initial location, and writing the input signal in the initial location, when the buffer location is the initial location;

increasing a value of the address information using a column counter, and determining if a changed buffer location is the initial location according to the increased address information; and writing current buffer values of rows of the inner memory in the outer memory according to the address information, when the changed buffer location is the initial location.

2. The method as claimed in claim 1, further comprising the steps of outputting a value of the buffer location and storing the input signal in the buffer location, when the buffer location is not the initial location.

3. A method for deinterleaving by an inner register in a deinterleaver including the inner register for temporarily storing a value of a specific row location of an inner memory, a row counter, and a column counter, the method comprising the steps of:

moving information of the inner memory corresponding to a row value, which is currently accessed, to the inner register and checking buffer location, when an input signal exists;

when the buffer location is an initial location, reading buffer values from an outer memory according to address information stored in the inner register, outputting a buffer value of the initial location, and storing the input signal in the initial location;

increasing a value of the address information using a column counter, and determining if a changed buffer location is the initial location according to the increased address information; and storing current buffer values of rows of the inner memory within the inner register in the outer memory according to the address information, when the changed buffer location is the initial location.

4. The method as claimed in claim 3, further comprising the steps of outputting a value of the buffer location and storing the input signal in the buffer location, when the buffer location is not the initial location.

5. The method as claimed in claim 3, wherein the inner register writes inner register values in the inner memory, when the changed buffer location is not the initial location.

* * * * *